United States Patent [19]
Dague et al.

[11] 4,164,716
[45] Aug. 14, 1979

[54] CLOCK LEVEL SHIFTING CIRCUIT

[75] Inventors: George I. Dague, North Andover, Mass.; Lawrence E. Murphy, Matawan, N.J.

[73] Assignee: Bell Telephone Laboratories, Incorporated, Murray Hill, N.J.

[21] Appl. No.: 908,284

[22] Filed: May 22, 1978

[51] Int. Cl.² .............................................. H03F 3/45
[52] U.S. Cl. .................................. 330/252; 330/255; 330/258; 330/306
[58] Field of Search .................... 330/11, 69, 107, 126, 330/252, 255, 258, 302, 304, 306

[56] References Cited

U.S. PATENT DOCUMENTS

| | | | |
|---|---|---|---|
| 3,610,956 | 10/1971 | Giordano et al. | 330/69 X |
| 3,737,793 | 6/1973 | Buch et al. | 330/11 |

FOREIGN PATENT DOCUMENTS

| | | | |
|---|---|---|---|
| 640711 | 5/1962 | Canada | 330/69 |

OTHER PUBLICATIONS

Benson et al., "DC Amplifier Having Fast Response to Step Waveform Inputs", *IBM Technical Disclosure Bulletin*, Jan. 1968, vol. 10, No. 8, pp. 1148, 1149.

Clapper, "Bandpass Filter Using Differential Amplifier", *IBM Technical Disclosure Bulletin*, Aug. 1971, vol. 14, No. 3, pp. 815, 816.

*Primary Examiner*—James B. Mullins
*Attorney, Agent, or Firm*—Roy C. Lipton

[57] ABSTRACT

A level shifting circuit for binary signals comprises a pair of equal value resistors connecting a common input signal to a pair of input terminals of a differential amplifier. A capacitor from one input terminal to ground stores the long term average input signal level for comparison with the instantaneous input signal level on the other input terminal. In another embodiment the range of input signal levels is modified by connecting equal value resistors from the input terminals to a voltage source. The invention provides amplification with minimum propagation delay, symmetrical propagation delay, a conventional logic level output signal and only requires a single power supply source for the amplifier circuit over a large range of input signal levels.

7 Claims, 4 Drawing Figures

CLOCK LEVEL SHIFTING CIRCUIT

FIELD OF THE INVENTION

This invention relates to level shifting circuits and more particularly to DC coupled differential amplifier circuits.

DESCRIPTION OF THE PRIOR ART

Conventional digital circuits often require binary input signals at fixed logic levels. It is often the case that low level binary signals having a nonfixed DC offset voltage are available but are not usable by such digital circuits. Further, in an application requiring precision circuitry, the well known techniques for converting a low level binary signal into a fixed logic level signal incur unacceptable propagation delays that may additionally be nonsymmetrical.

In prior art circuits, a series capacitor is typically utilized to confine the DC voltage level of an input electrical signal to one side of the capacitor and maintain a desired DC voltage level on the other side. Such a technique usually leads to multiple power supply voltages regardless of the expected range of input voltages and are not conveniently adaptable to logic level outputs. Feedback circuitry from an output stage to the input is a technique that sets the dynamic operating range of the output signal. Negative feedback operates to generate a known output state in the absence of an input signal and generally has an adverse effect on the symmetry of propagation delay through the circuit since the bias required to set the known state must be overcome. Positive feedback on the other hand only improves switching speed after an input signal has exceeded some threshold level; this technique is only an advantage to high level input signals and severely impairs low level signals.

In U.S. Pat. No. 3,832,646, issued to A. I. Szabo et al on Aug. 27, 1974 there is disclosed a technique for suppressing common mode noise. In this patent a network used in conjunction with a differential amplifier is adjusted to render the overall circuit immune to noise that combines equally with each amplifier input signal. Typically a differential amplifier amplifies the voltage difference between a pair of inputs while being relatively insensitive to the absolute value of the individual inputs. The ability of a differential amplifier to disregard a voltage that additively combines with voltages present on each input terminal is known as its Common Mode Rejection Ratio (CMRR) and is a figure of merit for a differential amplifier. In the above patent a network used in conjunction with a differential amplifier is adjusted to enhance the CMRR. Although a level shifting technique for a DC coupled circuit is suggested it is applicable only when two sources of input signals are available. Further, negative feedback and a plurality of voltage sources present drawbacks that are desirable to avoid.

It is therefore an object of the invention to provide an arrangement for amplifying a low level binary signal having a nonfixed DC offset voltage with a DC coupled circuit.

It is another object of this invention to minimize propagation delay while preserving symmetry when either inverted or noninverted output signals are required.

It is yet another object of this invention to provide an arrangement adaptable to the generation of conventional logic level output signals.

SUMMARY OF THE INVENTION

In accordance with this invention a differential amplifier amplifies a voltage difference between two input terminals. A common input signal is connected to each of the input terminals through a pair of identical impedance networks and a capacitor is connected from one of the input terminals to signal ground. This arrangement advantageously provides level shifting without the need for feedback circuitry in a DC coupled amplifier. The identical impedance networks preserve symmetrical propagation delays. One of the networks cooperates with the capacitor to provide low pass filtering in which the capacitor stores the long term average value of the input signal on one of the input terminals for comparison with the instantaneous value of the input signal on the other input terminal. Changing the input terminal to which the capacitor attaches operates to invert the output signal without affecting the magnitude or symmetry of the propagation delay.

It is an advantage of this invention that only a single power supply voltage is required for the amplifier circuit over a large range of input signal levels. It is another advantage of this invention that symmetrical and minimum propagation delay is accomplished for inverted and noninverted output signals.

In accordance with one embodiment of the invention the input terminals of a differential amplifier are exclusively connected to a common input signal source through equal value impedance networks.

In accordance with another embodiment of the invention the range of input signal levels is modified without requiring a second supply voltage for the amplifier by connecting equal value impedances from each of the impedance networks to a voltage source.

The foregoing and other objects and features of this invention will be more fully understood from the following description of illustrative embodiments taken in conjunction with the accompanying drawings.

DETAILED DESCRIPTION

Figure 1:
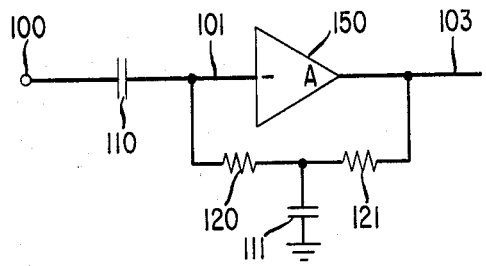
FIG. 1 discloses a prior art circuit for level shifting.

The prior art of FIG. 1 discloses a conventional technique for level shifting. Blocking capacitor 110 allows a DC voltage to be set up at amplifier input lead 101 that is independent of the DC voltage on input lead 100. Such a technique is well known and is utilized is multistage amplifiers. If the amplifier has a high gain then negative DC feedback from output lead 103 to input lead 101 is generally required to stabilize the output DC voltage level. So that amplification is not degraded, however, a low pass filter circuit in the feedback path, such as the one comprising resistors 120–121 and capacitor 111, is conventionally employed. The propagation delay of the amplifier is increased when saturation of any amplifier stage occurs, and symmetry of propagation delay is upset when different conditions are encountered between turning on a device and turning off the device. The circuit of FIG. 1 contemplates a high gain amplifier biased to be in a linear active region during quiescent conditions. Typical of such an amplifier is the need for an additional stage when a noninverted output signal is required.

Figure 2:
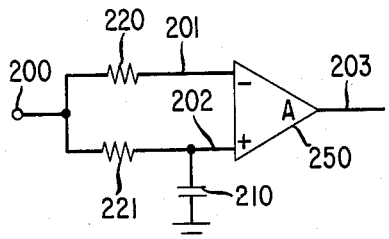
FIG. 2 shows, in schematic form, one embodiment of a level shifting circuit in accordance with this invention.

The diagram of FIG. 2 teaches a novel and simple technique for converting a low level binary input signal, having a nonfixed DC offset voltage, into a predetermined logic level signal. A differential amplifier is advantageously utilized to shift the level of the input signal without resorting to capacitive coupling and resetting DC quiescent voltage levels. The disclosed technique offers minimum propagation delay and readily adapts to symmetrical amplification which tends to keep the propagation delay of the high-to-low and low-to-high signal transitions nearly equal. Further, the circuit operates as an inverting or a noninverting amplifier by merely changing the location of the capacitor from one input terminal to the other. Moreover for a large class of input signal levels only a single supply voltage is required.

In FIG. 2, input signals on lead 200 are fed to amplifier 250 through resistors 220 and 221. Preferably these resistors are of equal value to nullify the effects of reverse leakage currents. Variations in the input signal are virtually unnoticed by amplifier 250 when there is a reasonable Common Mode Rejection Ratio (CMRR). The effect of capacitor 210 however is to track the long term value of the average input voltage and preserve the CMRR only for the low frequency components of the input signal. In the case of a binary input clock signal for example, "long term" refers to several periods of the repetition rate. Amplifier 250 therefore only amplifies short term voltage differences between input terminals 201 and 202. In the example embodiment of FIG. 2 the output signal on lead 203 is inverted with respect to the input signal on lead 200. The resistor-capacitor input combination is in effect a low pass filter although the result is that the entire circuit effectively operates as a high pass filter. The balanced input arrangement is readily adapted to symmetrical amplification techniques such as will be shown in the embodiment of FIG. 4. A balanced input network preserves the equal propagation delay for all signal transitions and the circuit of FIG. 3 demonstrates a method for varying the input DC bias voltage within the spirit of the invention.

Figure 3:
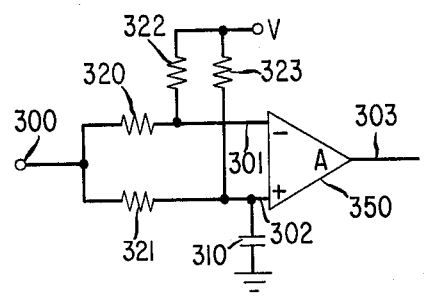
FIG. 3 shows, in schematic form, another embodiment of a level shifting circuit having a modified input signal range in accordance with this invention.
Figure 4:
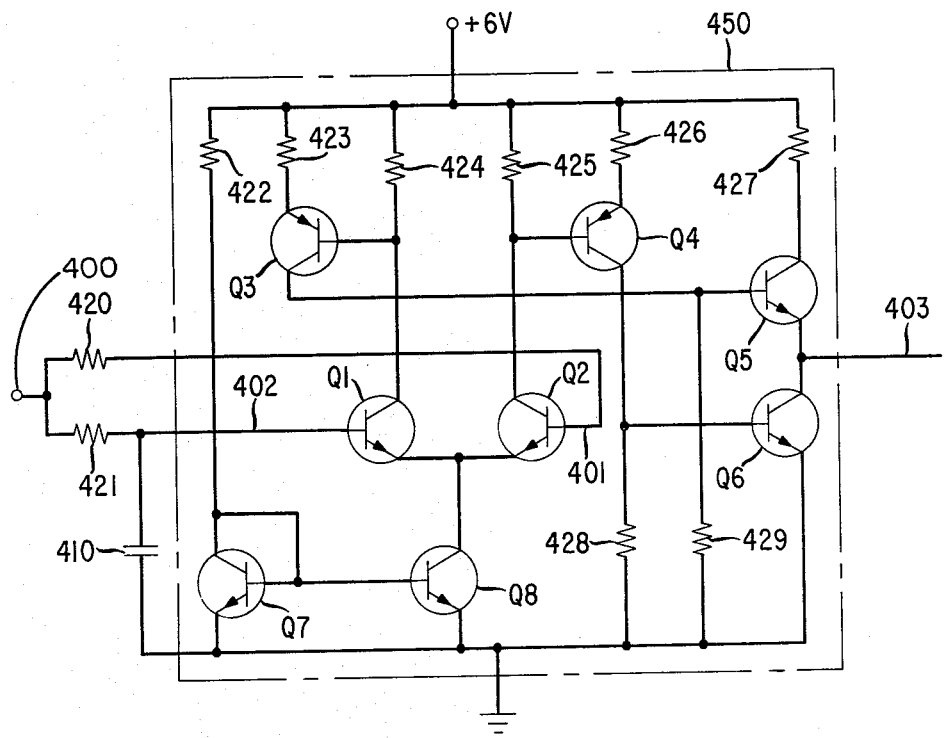
FIG. 4 discloses, in schematic form, a detailed circuit corresponding to FIG. 2 and adapted to the generation of TTL output signals.

In FIG. 3, DC balance is not upset when two substantially equal value resistors 322 and 323 are introduced. These resistors operate in conjunction with resistors 320 and 321 to raise or lower the effective DC value of the input signal on lead 300 depending upon the polarity of voltage V and the magnitude of resistors 320-324. Resistors 322 and 323 are not necessary to the inventive concept and are avoidable by selection of the internal supply voltage(s) for amplifier 350 or by an additional resistor network at input lead 300. Such a technique is utilized when the dynamic range of the input signal varies over a range that exceeds that of the differential amplifier. In many cases, however, the low level input signal is confined to a range whereby a differential amplifier having a single voltage supply is adequate. FIG. 4 discloses a technique for taking advantage of an input signal having such characteristics although the discussion in connection with FIG. 3 is applicable otherwise.

FIG. 4 is an illustrative embodiment of the invention for which the following component values are deemed acceptable.

| Component | Value |
| --- | --- |
| 410 | 2000 pf |
| 420 | 1000 ohms |
| 421 | 1000 ohms |
| 422 | 3320 ohms |
| 423 | 65 ohms |
| 424 | 787 ohms |
| 425 | 787 ohms |
| 426 | 91 ohms |
| 427 | 100 ohms |
| 428 | 250 ohms |
| 429 | 1000 ohms |

For purposes of symmetrical propagation delay transistors Q1 and Q2 should have as nearly identical characteristics as possible as well as transistors Q3 and Q4. Such matching is possible when these transistor pairs share a common substrate.

An input signal on lead 400 is delivered through resistors 421 and 420 to the base leads of transistors Q1 and Q2 corresponding to input terminals 401 and 402 of amplifier 450. Capacitor 410 and resistor 421 filter out the high frequency components of the input signal and deliver only the long term DC average of the input signal to Q1. As a result the DC average of the input signal may vary without upsetting the differential gain of the Q1-Q2 pair. When the instantaneous value of the input voltage on lead 400 exceeds the long term average voltage stored on capacitor 410, Q2 is turned on and Q1 is turned off by the inherent feedback of the emitter connection in the differential pair. Alternatively when the instantaneous value of the input voltage on lead 400 is less than the long term average voltage stored on capacitor 410, Q2 is turned off and Q1 is turned on. Transistor Q8 is shown connected to ground but if connected to a negative voltage supply would extend the allowable range of the input signals.

Transistor Q8 is part of a current mirror circuit including resistor 422 and transistor Q7; it provides a constant current drain to the differential pair Q1-Q2. The value of the constant current flowing through transistor Q8 is identical to the current flowing through transistor Q7 to the extent that they are matched. For the component values shown, the amount of current flowing through transistor Q8 is approximately equal to $$\frac{6.0 - 0.7 \text{ (volts)}}{3320 \text{ (ohms)}} = 1.60 \, ma$$

Transistors Q3 and Q4 are current switches and will alternate switching as the Q1-Q2 differential pair alternates. That is: when Q1 is on, Q3 is on (Q2 and Q4 are off); when Q2 is on, Q4 is on (Q1 and Q3 are off). The output stage generates a TTL level signal utilizing active pull-up transistor Q5 and active pull-down transistor Q6. This stage will switch depending on the status of the current switches.

It is important to note that symmetrical design tends to keep the propagation delay of the high-to-low and the low-to-high signal transitions nearly equal. It is further noted that symmetry advantageously extends to the input signal source. Unequal propagation delay will result when the balance of transistors Q1 and Q2 is disturbed such as through unequal bias currents flowing into the base of transistors Q1 and Q2. Connections of unequal conductivity from the Q1-Q2 transistor bases to any voltage source (including ground) are to be avoided.

The use of complementary transistor pairs in the differential amplifier enhances symmetry by the "push-pull" action that accompanies every signal transition whether it be the low state to high state transition or vice versa. In such complementary pairs, one transistor is turning on in parallel cooperation with another transistor turning off. Such cooperation not only provides symmetrical operation but also increases speed.

High speed is further enhanced by the use of a minimum number of amplification stages, current switching and the avoidance of saturation techniques such as positive feedback. The speed of operation is preserved when requirements dictate a change in the input/output phase relationship. Changing the input terminal to which the capacitor attaches operates to change this phase relationship. Prior art techniques most generally add an inversion state to change the input/output phase relationship; such a technique adds to the overall propagation delay.

Although a specific embodiment of this invention has been described it will be understood that the various modifications may be made without departing from the spirit of the invention.

What is claimed is:

1. In combination with a multistage differential amplifier, having a differential pair of NPN transistors ($Q_1$, $Q_2$) in the first stage and a pair of PNP current sources ($Q_3$, 423, 424-$Q_4$, 425, 426) in the second stage, for amplifying the voltage difference between two input terminals without feedback to either of the input terminals, a circuit characterized essentially by:
   a first impedance network connecting an input signal to one of the input terminals;
   a second impedance network, structurally identical to said first impedance network, connecting said input signal to the other input terminal in a manner identical to the first impedance network; and
   a capacitor connecting one of the input terminals to signal ground, said impedance networks and said capacitor comprising the sole connections to the input terminals.

2. In combination with a differential amplifier according to claim 1 wherein said first and second impedance networks comprise resistors having equal value.

3. In combination with a differential amplifier according to claim 1 wherein said first and said second stage have matched transistors and exhibit substantial bilateral symmetry.

4. A differential amplifier, having a first and a second stage wherein the first stage comprises a differential pair of NPN transistors ($Q_1$, $Q_2$) and the second stage comprises a pair of PNP current sources ($Q_3$, 423, 424-$Q_4$, 425, 426), for amplifying the voltage difference between two input terminals and whose only inputs are delivered through a network consisting essentially of:
   a first impedance interconnecting an input signal exclusively with one input terminal and providing the input signal as the sole voltage source to said one input terminal; and
   a second impedance interconnecting the input signal exclusively with the other input terminal and a capacitor interconnecting said other input terminal with signal ground and providing the input signal and the signal ground as the sole voltage sources to said other input terminal.

5. A differential amplifier according to claim 4 wherein said first and second impedances are resistors whose magnitudes are substantially equal.

6. A differential amplifier according to claim 5 wherein the time constant of one of the resistors and the capacitor exceeds the maximum period of a signal from the input signal source.

7. In combination with a multistage differential amplifier having a differential pair of NPN transistors ($Q_1$, $Q_2$) in the first stage and a pair of PNP current sources ($Q_3$, 423, 424-$Q_4$, 425, 426) in the second stage, said amplifier amplifying the voltage difference between two input terminals without feedback to either of the input terminals, a circuit characterized essentially by:
   a first impedance network (320, 322) connecting an input signal and a voltage source to one of the input terminals;
   a second impedance network (321, 323), structurally identical to said first impedance network, connecting said input signal and said voltage source to the other input terminal in a manner identical to the first impedance network; and
   a capacitor connecting one of the input terminals to signal ground, said impedance networks and said capacitor comprising the sole connections to the input terminals.

* * * * *